US012584054B2

(12) United States Patent
Yasuda et al.

(10) Patent No.: US 12,584,054 B2
(45) Date of Patent: Mar. 24, 2026

(54) SEMICONDUCTOR PRODUCTION DEVICE SEALING MATERIAL

(71) Applicant: MITSUBISHI CABLE INDUSTRIES, LTD., Tokyo (JP)

(72) Inventors: Hiroaki Yasuda, Amagasaki (JP); Takehiro Hamamura, Tokyo (JP); Takao Ito, Amagasaki (JP)

(73) Assignee: MITSUBISHI CABLE INDUSTRIES, LTD., Tokyo (JP)

( * ) Notice: Subject to any disclaimer, the term of this patent is extended or adjusted under 35 U.S.C. 154(b) by 701 days.

(21) Appl. No.: 17/784,638

(22) PCT Filed: Dec. 8, 2020

(86) PCT No.: PCT/JP2020/045739

§ 371 (c)(1),
(2) Date: Jun. 11, 2022

(87) PCT Pub. No.: WO2021/117743

PCT Pub. Date: Jun. 17, 2021

(65) Prior Publication Data

US 2023/0017563 A1      Jan. 19, 2023

(30) Foreign Application Priority Data

Dec. 11, 2019      (JP) ................................. 2019-223673

(51) Int. Cl.
*C09K 3/10*          (2006.01)
*H01L 23/29*         (2006.01)
*H10W 74/47*         (2026.01)

(52) U.S. Cl.
CPC ......... *C09K 3/1009* (2013.01); *H10W 74/476* (2026.01); *C09K 2200/0247* (2013.01); *C09K 2200/0607* (2013.01)

(58) Field of Classification Search
CPC .......... C08L 27/12; C08L 61/06; C08L 27/18; C08L 2666/14; C08L 101/00; C09K 3/10; C09K 3/1009; C09K 2200/0607; C09K 15/04; C08K 5/13
See application file for complete search history.

(56) References Cited

U.S. PATENT DOCUMENTS 4,946,883 A * 8/1990 Kunimatsu ............. C08L 27/12
                                                      524/265
2008/0153986 A1   6/2008  Maeda et al.

2009/0093590 A1   4/2009  Okazaki
2016/0319102 A1  11/2016  Osumi et al.
2018/0355487 A1  12/2018  Hirano
2023/0174763 A1   6/2023  Yasuda et al.

FOREIGN PATENT DOCUMENTS

| CN | 102336878 A | * | 2/2012 | |
| CN | 102844177 A | | 12/2012 | |
| CN | 106751237 A | | 5/2017 | |
| EP | 2 540 494 A1 | | 1/2013 | |
| JP | 58-152032 A | | 9/1983 | |
| JP | H06278153 A | * | 10/1994 | ........... B30B 15/061 |
| JP | 2003041238 A | * | 2/2003 | |
| JP | 2004044745 A | * | 2/2004 | |
| JP | 4628814 B2 | | 2/2011 | |
| JP | 2017-179210 A | | 10/2017 | |
| JP | 6230415 B2 | | 11/2017 | |
| JP | 2018-204086 A | | 12/2018 | |
| JP | 2020-070326 A | | 5/2020 | |
| KR | 10-0840484 B1 | | 6/2008 | |
| WO | WO-2017170827 A1 | * | 10/2017 | ............. B32B 25/08 |

OTHER PUBLICATIONS

Machine translation of JP-2004044745-A (Year: 2004).*
Machine translation of WO2017170827A1 (Year: 2017).*
Machine translation of JP-H06278153-A (Year: 1994).*
Nipsil Silica Catalog, Tosoh Silica Corporation (Year: 2023).*
Machine translation of CN-102336878-A (Year: 2011).*
Machine translation of JP-H06278153-A, including a machine translation of Table 1 (Year: 1994).*
Machine translation of JP-2003041238-A (Year: 2003).*
KR Office Action dated Sep. 28, 2021 as received in Application No. 2019-223673.
KR Decision to Grant Dated Dec. 10, 2021 as received in Application No. 2019-223673.
KR Office Action dated Jul. 31, 2025 as received in Application No. 10-2022-7019184.

* cited by examiner

*Primary Examiner* — Amber R Orlando
*Assistant Examiner* — Ryan Patrick Loughran
(74) *Attorney, Agent, or Firm* — Maschoff Brennan

(57)                ABSTRACT

A seal material for a semiconductor manufacturing device is made of a rubber composition containing fluororubber and phenol resin powder. The content of the phenol resin powder is 1 part by mass or more and 50 parts by mass or less with respect to 100 parts by mass of the fluororubber. The average particle size of the phenol resin powder is 1 μm or more and 20 μm or less.

3 Claims, No Drawings

SEMICONDUCTOR PRODUCTION DEVICE SEALING MATERIAL

TECHNICAL FIELD

The present disclosure relates to a seal material for a semiconductor manufacturing device.

BACKGROUND ART

In a mechanical device, a seal material made of, e.g., a rubber composition is used for obtaining air tightness. The properties of the seal material include the hardness, tensile strength, compression set, etc. Specific property requirements vary depending on intended use. The seal material for use in a semiconductor manufacturing device is required to generate less dust even when exposed to plasma.

CITATION LIST

Patent Documents

Patent Document 1: Japanese Unexamined Patent Publication No. 2017-179210
Patent Document 2: Japanese Patent No. 04628814
Patent Document 3: Japanese Patent No. 06230415

SUMMARY OF THE INVENTION

Technical Problem

It is an object of the present disclosure to provide a seal material achieving both improvement in the compression set and reduction in dust generation in the case of using the seal material for a semiconductor manufacturing device.

Solution to the Problem

A seal material for a semiconductor manufacturing device according to the present disclosure is made of a rubber composition containing fluororubber and phenol resin powder. The content of the phenol resin powder is 1 part by mass or more and 50 parts by mass or less with respect to 100 parts by mass of the fluororubber. The average particle size of the phenol resin powder is 1 μm or more and 20 μm or less.

Advantages of the Invention

The seal material for the semiconductor manufacturing device according to the present disclosure can achieve both improvement in the compression set and reduction in dust generation.

DESCRIPTION OF EMBODIMENT

A seal material for a semiconductor manufacturing device in the present embodiment is made of a rubber composition that includes fluororubber as a rubber component and contains phenol resin powder. A combination of such a rubber component and a compound ingredient achieves desired characteristics, such as desired compression set, and a reduction in the dust generation even in the case of exposure to plasma.

Silicone rubber, EPDM, etc., may be used as the rubber component forming the seal material for the semiconductor manufacturing device, in addition to the fluororubber. However, no improvement is shown in the compression set when phenol resin powder is added to the silicone rubber, which will be further described later. When phenol resin powder is added to EPDM, a surface layer cures strongly and cracking occurs. Thus, such a mixture is not suitable as the seal material.

In the seal material of the present embodiment, examples of the fluororubber include, for example, a copolymer (binary FKM) of vinylidene fluoride (VDF) and hexafluoropropylene (HFP), a copolymer (ternary FKM) of vinylidene fluoride (VDF), hexafluoropropylene (HFP), and tetrafluoroethylene (TFE), a copolymer (FEP) of tetrafluoroethylene (TFE) and propylene (Pr), a copolymer of vinylidene fluoride (VDF), propylene (Pr), and tetrafluoroethylene (TFE), a copolymer (ETFE) of ethylene (E) and tetrafluoroethylene (TFE), a copolymer of ethylene (E), tetrafluoroethylene (TFE), and perfluoromethyl vinyl ether (PMVE), a copolymer of vinylidene fluoride (VDF), tetrafluoroethylene (TFE), and perfluoromethyl vinyl ether (PMVE), a copolymer of vinylidene fluoride (VDF) and perfluoromethyl vinyl ether (PMVE), a copolymer of tetrafluoroethylene (TFE) and perfluoroalkyl ether (PFAE), etc. One kind or two or more kinds of these substances are used in one preferred embodiment.

Of the above-described substances, binary FKM, ternary FKM, FEPM, FFKM, and perfluoropolyether are more preferred.

A method of crosslinking the fluororubber includes polyol crosslinking and peroxide (organic peroxide) crosslinking. Peroxide crosslinking is preferred.

Polyol crosslinking is better than peroxide crosslinking in terms of the compression set. However, in the case of polyol crosslinking, HF is generated upon crosslinking reaction, and for this reason, MgO, Ca(OH)$_2$, etc., need to be added for absorbing HF. As a result, fluororubber subjected to polyol crosslinking tends to contain a greater amount of metal and generate dust more easily under plasma environment, as compared to fluororubber subjected to peroxide crosslinking. For this reason, peroxide crosslinking is more suitable as the seal material for the semiconductor manufacturing device. Peroxide crosslinking is more suitable also in terms of chemical resistance and steam resistance (tending to be degraded due to the metal oxide). However, polyol crosslinking is not excluded because fluororubber subjected to polyol crosslinking also produces an improvement in the compression set when phenol resin powder is added to the fluororubber.

Peroxide is a thermal crosslinking agent that crosslinks the rubber component when heated to a predetermined temperature. Specific examples include 1,1-bis(t-butyl peroxy)-3,5,5-trimethylcyclohexane, 2,5-dimethylhexane-2,5-dihydroperoxide, di-t-butyl peroxide, t-butyl cumyl peroxide, dicumyl peroxide, α,α-bis(t-butyl peroxy)-p-diisopropylbenzene, 2,5-dimethyl-2,5-di(t-butylperoxy) hexane, 2,5-dimethyl-2,5-di(t-butylperoxy)-hexyne-3, benzoyl peroxide, t-butyl peroxybenzene, t-butyl peroxymaleic acid, t-butyl peroxy isopropylcarbonate, and t-butyl peroxybenzoate. As peroxide, one kind or two or more kinds of these substances are used in one preferred embodiment. In order to obtain excellent physical properties, 2,5-dimethyl-2,5-di(t-butylperoxy)hexane is used in one more preferred embodiment.

Bisphenols are suitable as a polyol-based crosslinking agent. Specific examples include polyhydroxy aromatic compounds such as 2,2-bis(4-hydroxyphenyl)propane [bisphenol A], 2,2-bis(4-hydroxyphenyl)perfluoropropane [bisphenol AF], bis(4-hydroxyphenyl)sulfone [bisphenol S], bisphenol A-bis(diphenyl phosphate), 4-4'-dihydroxydiphe-nyl, 4,4'-dihydroxydiphenylmethane, and 2,2-bis(4-hy-droxyphenyl)butane. In order to obtain excellent physical properties, bisphenol A, bisphenol AF, etc., are suitable as polyol. These substances may be in the form of alkali metal salt or alkaline earth metal salt.

The phenol resin used in the seal material of the present embodiment is preferably a phenol resin whose reaction has been completed. For example, a phenol resin, the extract of which after being heated and refluxed in methanol is 10% by mass or less is preferred. Phenol resin having a free phenol content of 500 ppm or less is preferred.

In order to improve the compression set, the content of the phenol resin is preferably 1 part by mass or more, and more preferably 5 parts by mass or more with respect to 100 parts by mass of the rubber component. For the same purpose, the content of the phenol resin is preferably 50 parts by mass or less, more preferably 25 parts by mass or less, and much more preferably 15 parts by mass or less.

In order to improve the compression set, the average particle size of the phenol resin powder is preferably 1 μm or more. For the same purpose, the average particle size is preferably 20 μm or less, more preferably 10 μm or less, and much more preferably 6 μm or less.

In the present embodiment, the average particle size is the 50% particle size measured by a laser diffraction scattering method.

The fluororubber composition forming the seal material of the present embodiment may contain a compound ingredient other than the phenol resin powder.

For example, the fluororubber composition may contain silica powder. With silica contained, the fluororubber com-position is formed into a fluororubber product with excellent crushing resistance when crosslinked and shaped. Silica is preferably synthetic amorphous silica, such as dry silica or wet silica, more preferably dry silica, such as hydrophilic dry silica or hydrophobic dry silica, and much more pref-erably hydrophobic dry silica.

In order to obtain excellent physical properties including crushing resistance, the content of silica is preferably 1 part by mass or more, and more preferably 5 parts by mass or more, and preferably 30 parts by mass or less, and more preferably 20 parts by mass or less with respect to 100 parts by mass of the rubber component.

Silica may be subjected to surface treatment. For example, surface treatment using a silane coupling agent is performed to introduce a methyl group, a dimethyl group, a trimethyl group, etc.

Silica is in the form of powder in one preferred embodi-ment. The specific surface area of the silica powder accord-ing to a BET theory is preferably 50 m$^2$/g or more, and more preferably 80 m$^2$/g or more.

Carbon black may be used as a compound ingredient for the fluororubber composition. If carbon black is added, dust is generated easily under plasma environment, and it is better not to add carbon black in this respect. However, the fluororubber composition containing carbon black also pro-duces an improvement in the compression set when phenol resin powder is further added. The content of the carbon black is preferably 5 parts by mass or less, more preferably 3 parts by mass or less, and most preferably 0 parts by mass with respect to 100 parts by mass of the fluororubber.

The fluororubber composition forming the seal material of the present embodiment may further contain a hydrogen site protecting agent. The hydrogen site protecting agent is a compound to be bonded to a carbon radical generated as a result of breakage of a carbon-hydrogen bond of the rubber component upon radiation emission during manufacture of the rubber product.

In one preferred embodiment, the hydrogen site protect-ing agent contains a compound having a perfluoro skeleton having an alkenyl group bonded to the carbon radical of the rubber component in a molecule and/or a compound having a siloxane skeleton having an alkenyl group bonded to the carbon radical of the rubber component in a molecule. Examples of the alkenyl group include a vinyl group, an allyl group, a butenyl group, a pentenyl group, a hexenyl group, a heptenyl group, etc. Among these alkenyl groups, the vinyl group is preferred.

Examples of the compound having the perfluoro skeleton having the alkenyl group in the molecule include a com-pound having a perfluoropolyether structure, a compound having a perfluoroalkylene structure, etc. Examples of the compound having the siloxane skeleton having the alkenyl group in the molecule include a polymer of methylvinylsi-loxane, a polymer of dimethylsiloxane, a copolymer of dimethylsiloxane and methylvinylsiloxane, a copolymer of dimethylsiloxane, methylvinylsiloxane, and methyl phenyl-siloxane, etc. Other examples include organopolysiloxane containing an alkenyl group in a molecule, such as addition-polymerized liquid silicone rubber. In one preferred embodi-ment, one kind or two or more kinds of these substances may be used as the hydrogen site protecting agent.

In order to enhance plasma resistance, the content of the hydrogen site protecting agent is preferably 1 part by mass or more, and more preferably 5 parts by mass or more, and preferably 20 parts by mass or less, and more preferably 15 parts by mass or less with respect to 100 parts by mass of the rubber component.

The fluororubber composition may further contain a plas-ticizer, a processing aid, a vulcanization accelerator, an antioxidant, etc.

The uncrosslinked fluororubber composition may be pre-pared using an open rubber mixer, such as an open roll, or a closed rubber mixer, such as a kneader. Among these mixers, the open rubber mixer such as an open roll, in particular, provides excellent processability in kneading.

Processing using a mold, for example, is performed to form a seal material from the fluororubber composition described above. That is, a cavity of a preheated mold is filled with a predetermined amount of an uncrosslinked fluororubber composition according to the present embodi-ment, and the mold is clamped. In this state, the mold is held for a predetermined molding time under a predetermined molding temperature and a predetermined molding pressure. While in this period, the uncrosslinked fluororubber com-position is formed into the shape of the cavity, and the rubber component is crosslinked by the crosslinking agent and loses the plasticity. The molding may be press molding or injec-tion molding. The molding temperature is, for example, 150° C. or more and 180° C. or less. The molding pressure is, for example, 0.1 MPa or more and 25 MPa or less. The molding time is, for example, 3 minutes or more and 20 minutes or less. Then, the mold is opened, and the molded object is taken out of the mold and is cooled. The rubber product can be obtained in this manner. The molded object taken out of the mold may be subjected to further heat treatment under a heating temperature of 150° C. or more and 250° C. or less for a heating time of 2 hours or more and 24 hours or less.

EXAMPLES

Hereinafter, the seal material for the semiconductor manufacturing device according to the present disclosure will be described with reference to Examples 1 to 9 and Comparative Examples 1 to 16.

—Production of Seal Material—

Example 1

To 100 parts by mass of FKM (trade name: Tecnoflon P959, manufactured by Solvay) of a fluororubber component, 1.5 parts by mass of an organic peroxide (trade name: PERHEXA 25B, manufactured by NOF Corporation) as a crosslinking agent, 2.0 parts by mass of triallyl isocyanurate (TAIC, manufactured by Mitsubishi Chemical Corporation) as a crosslinking aid, and 1 part by mass of phenol resin powder (trade name: BellPearl R100, manufactured by Air Water Bellpearl Inc.) were added. The resultant was kneaded with an open roll. The kneaded compound was press-molded at 160° C. for 10 minutes. Thereafter, secondary crosslinking was performed in a gear oven at 200° C. for 4 hours. The resultant seal material was taken as a seal material of Example 1. The average particle size of BellPearl R100 is 1.5 μm.

Example 2

A seal material of Example 2 was produced in the same manner as Example 1, except that the content of phenol resin powder (BellPearl R100) was 10 parts by mass (with respect to 100 parts by mass of the fluororubber; hereinafter, the mass part of a compound ingredient may sometimes be shown without describing that the mass part of the compound ingredient is a value with respect to 100 parts by mass of the rubber component).

Example 3

A seal material of Example 3 was produced in the same manner as Example 1, except that the content of phenol resin powder (BellPearl R100) was 25 parts by mass.

Example 4

A seal material of Example 4 was produced in the same manner as Example 1, except that the content of phenol resin powder (BellPearl R100) was 50 parts by mass.

Example 5

A seal material of Example 5 was produced in the same manner as Example 1, except that 10 parts by mass of BellPearl R200 (which is a trade name and manufactured by Air Water Bellpearl Inc.) were used as phenol resin powder instead of BellPearl R100. The average particle size of BellPearl R200 is 5.8 μm.

Example 6

A seal material of Example 6 was produced in the same manner as Example 2, except that 10 parts by mass of carbon black (trade name: Thermax N990, manufactured by Cancarb Limited) were further added as a compound ingredient.

Example 7

To 100 parts by mass of FKM (trade name: Viton E60C, manufactured by The Chemours Company) of a fluororubber component, 3 parts by mass of magnesium oxide (trade name: Kyowamag 150, manufactured by Kyowa Chemical Industry Co., Ltd.) as an acid acceptor, 6 parts by mass of calcium hydroxide (trade name: CALVIT, manufactured by Ohmi Chemical Industry Co., Ltd.) as an acid acceptor, 10 parts by mass of phenol resin powder (BellPearl R100), and 25 parts by mass of carbon black (Thermax 1990) were added. The resultant was kneaded with an open roll. The kneaded compound was press-molded at 170° C. for 20 minutes. Thereafter, secondary crosslinking was performed in a gear oven at 200° C. for 24 hours. The resultant seal material was taken as a seal material of Example 7.

Example 8

A seal material of Example 8 was produced in the same manner as Example 2, except that press conditions were set to 160° C. for 5 minutes and that secondary crosslinking was not performed.

Example 9

A seal material of Example 9 was produced in the same manner as Example 8, except that the content of organic peroxide (PERHEXA 25B) was 0.3 parts by mass.

Comparative Example 1

A seal material of Comparative Example 1 was produced in the same manner as Example 1, except that phenol resin powder (BellPearl R100) was not added.

Comparative Example 2

A seal material of Comparative Example 2 was produced in the same manner as Example 1, except that 10 parts by mass of carbon black (Thermax N990) were added instead of phenol resin powder (BellPearl R100).

Comparative Example 3

A seal material of Comparative Example 3 was produced in the same manner as Example 1, except that 25 parts by mass of carbon black (Thermax N990) were added instead of phenol resin powder (BellPearl R100).

Comparative Example 4

A seal material of Comparative Example 4 was produced in the same manner as Example 1, except that 10 parts by mass of carbon black (trade name: DIABLACK H, manufactured by Mitsubishi Chemical Corporation) were added instead of phenol resin powder (BellPearl R100).

Comparative Example 5

A seal material of Comparative Example 5 was produced in the same manner as Example 1, except that 10 parts by mass of silica (trade name: AEROSIL R972, manufactured by Nippon Aerosil Co., Ltd.) were added instead of phenol resin powder (BellPearl R100).

Comparative Example 6

A seal material of Comparative Example 6 was produced in the same manner as Example 1, except that 10 parts by mass of silica spherical composite cured melamine resin particles (trade name: OPTOBEADS 2000M, manufactured by Nissan Chemical Corporation) were added instead of phenol resin powder (BellPearl R100).

Comparative Example 7

A seal material of Comparative Example 7 was produced in the same manner as Example 1, except that 10 parts by mass of fluororesin powder (trade name: KYNAR MG15, manufactured by Arkema) were added instead of phenol resin powder (BellPearl R100).

Comparative Example 8

A seal material of Comparative Example 8 was produced in the same manner as Example 1, except that 25 pans by mass of fluororesin (PVDF) powder (KYNAR MGI 5) were added instead of phenol resin powder (BellPearl R100).

Comparative Example 9

A seal material of Comparative Example 9 was produced in the same manner as Example 1, except that 10 parts by mass of fluororesin (PTFE) powder (trade name: Fluon L173JE, manufactured by AGC Inc.) were added instead of phenol resin powder (BellPearl R100).

Comparative Example 10

A seal material of Comparative Example 10 was produced in the same manner as Example 7, except that phenol resin powder (BellPearl R100) was not added.

Comparative Example 11

A seal material of Comparative Example 11 was produced in the same manner as Example 8, except that 10 parts by mass of carbon black (Thermax N990) were added instead of phenol resin powder (BellPearl R100).

Comparative Example 12

A seal material of Comparative Example 12 was produced in the same manner as Example 9, except that 10 parts by mass of carbon black (Thermax N990) were added instead of phenol resin powder (BellPearl R100).

Comparative Example 13

A seal material of Comparative Example 13 was produced in the same manner as Example 1, except that 10 parts by mass of BellPearl R800 (which is a trade name and manufactured by Air Water Bellpearl Inc.) were added as phenol resin powder instead of BellPearl R100. The average particle size of BellPearl R800 is 22 μm.

Comparative Example 14

To 100 parts by mass of vinyl methyl silicone rubber (trade name: KE-871C-U, manufactured by Shin-Etsu Chemical Co., Ltd), 1 part by mass of organic peroxide (trade name: C-8, manufactured by Shin-Etsu Chemical Co., Ltd.) as a crosslinking agent was added. The resultant was kneaded with an open roll. The kneaded compound was press-molded at 160° C. for 10 minutes. Thereafter, secondary crosslinking was performed in a gear oven at 200° C. for 4 hours. The resultant seal material was taken as a seal material of Comparative Example 14.

Comparative Example 15

A seal material of Comparative Example 15 was produced in the same manner as Comparative Example 14, except that 10 parts by mass of phenol resin powder (BellPearl R100) were added as a compound ingredient upon kneading.

Comparative Example 16

To 100 parts by mass of ethylene propylene diene rubber (trade name: EP51, manufactured by JSR Corporation), 1.5 parts by mass of organic peroxide (PERHEXA 25B), 2.0 parts by mass of a crosslinking aid (TAIC), and 10 parts by mass of phenol resin powder (BellPearl R100) were added. The resultant was kneaded with an open roll. The kneaded compound was press-molded at 160° C. for 30 minutes. Thereafter, secondary crosslinking was performed in a gear oven at 160° C. for 1 hour. The resultant seal material was taken as a seal material of Example 1. The resultant seal material was taken as a seal material of Comparative Example 16.

—Test Evaluation Method—

(Hardness)

The hardness of the seal material produced was measured as an instantaneous value by means of a type A durometer in accordance with HS K6253-3.

(Tensile Strength, Elongation, 100% Modulus)

The tensile strength, elongation, and 100% modulus of the seal material produced were measured using a No. 3 dumbbell-shaped test piece having a thickness of 2 mm based on HS K6252.

(Compression Set)

The compression set of the seal material produced was measured based on JIS K6262, using a test piece obtained by cutting an AS-214 O-ring in half.

(Plasma Resistance)

The plasma resistance of the seal material produced was measured by exposing an AS-214 O-ring to plasma by means of a small plasma etching device (manufactured by Shinko Seiki Co., Ltd.) and obtaining a weight reduction rate. In this measurement, the following conditions were set: a high-frequency power source was 1500 W; gas was $O_2+CF_4$ (50:1); a pressure was 100 Pa; and a time was 30 minutes.

Further, the appearance of the exposed O-ring was visually observed to confirm the presence or absence of dust.

(Vulcanization Rate)

As a vulcanization rate at the time of producing the seal material, t90 was obtained using a device in conformity with HS K6300-2.

—Test Evaluation Results—

TABLE 1

| | | | Example | | | | | Comparative Example | |
|---|---|---|---|---|---|---|---|---|---|
| | | | 1 | 2 | 3 | 4 | 5 | 1 | 2 |
| Base Rubber | FKM | Tecnoflon P959 | 100 | 100 | 100 | 100 | 100 | 100 | 100 |
| Crosslinking Agent | Organic Peroxide | PERHEXA 25B | 1.5 | 1.5 | 1.5 | 1.5 | 1.5 | 1.5 | 1.5 |
| Crosslinking Aid | Polyfunctional Compound | TAIC | 2 | 2 | 2 | 2 | 2 | 2 | 2 |

TABLE 1-continued

| Filler | Phenol Resin | BellPearl R100 | 1 | 10 | 25 | 50 | — | — | — |
|---|---|---|---|---|---|---|---|---|---|
| | | BellPearl R200 | — | — | — | — | 10 | — | — |
| | | BellPearl R800 | — | — | — | — | — | — | — |
| | Carbon Black | Thermax N990 | — | — | — | — | — | — | 10 |
| | | DIABLACK H | — | — | — | — | — | — | — |
| | Silica | AEROSIL R972 | — | — | — | — | — | — | — |
| | Silica-Melamine Complex | OPTOBEADS 2000M | — | — | — | — | — | — | — |
| | PVDF | KYNAR MG15 | — | — | — | — | — | — | — |
| | PTFE | Fluon L173JE | — | — | — | — | — | — | — |
| Normal Physical Properties | Hardness (Type-A) | | 51 | 58 | 69 | 85 | 58 | 51 | 55 |
| | Tensile Strength (Mpa) | | 12 | 15 | 20 | 21 | 12 | 8.9 | 15 |
| | Elongation (%) | | 270 | 210 | 190 | 120 | 230 | 290 | 210 |
| | 100% Modulus (Mpa) | | 1.4 | 2.8 | 7.5 | 17 | 2.2 | 1.3 | 2.8 |
| Thermal Resistance | Compression Set (%) | | 20 | 13 | 17 | 24 | 13 | 27 | 25 |
| Plasma Resistance | Weight Reduction Rate (%) | | 2 | 2.1 | 2.3 | 2.6 | 2.2 | 2 | 3.1 |
| | Dust Generation | | A | A | A | A | A | A | B |

| | | | Comparative Example | | | | | | | |
|---|---|---|---|---|---|---|---|---|---|---|
| | | | 3 | 4 | 5 | 6 | 7 | 8 | 9 | 13 |
| Base Rubber | FKM | Tecnoflon P959 | 100 | 100 | 100 | 100 | 100 | 100 | 100 | 100 |
| Crosslinking Agent | Organic Peroxide | PERHEXA 25B | 1.5 | 1.5 | 1.5 | 1.5 | 1.5 | 1.5 | 1.5 | 1.5 |
| Crosslinking Aid | Polyfunctional Compound | TAIC | 2 | 2 | 2 | 2 | 2 | 2 | 2 | 2 |
| Filler | Phenol Resin | BellPearl R100 | — | — | — | — | — | — | — | — |
| | | BellPearl R200 | — | — | — | — | — | — | — | — |
| | | BellPearl R800 | — | — | — | — | — | — | — | 10 |
| | Carbon Black | Thermax N990 | 25 | — | — | — | — | — | — | — |
| | | DIABLACK H | — | 10 | — | — | — | — | — | — |
| | Silica | AEROSIL R972 | — | — | 10 | — | — | — | — | — |
| | Silica-Melamine Complex | OPTOBEADS 2000M | — | — | — | 10 | — | — | — | — |
| | PVDF | KYNAR MG15 | — | — | — | — | 10 | 25 | — | — |
| | PTFE | Fluon L173JE | — | — | — | — | — | — | 10 | — |
| Normal Physical Properties | Hardness (Type-A) | | 68 | 63 | 65 | 59 | 55 | 68 | 55 | 58 |
| | Tensile Strength (Mpa) | | 24 | 23 | 20 | 18 | 13 | 17 | 16 | 9.5 |
| | Elongation (%) | | 260 | 220 | 270 | 210 | 280 | 270 | 350 | 240 |
| | 100% Modulus (Mpa) | | 5.6 | 3.7 | 3.7 | 2.5 | 2.3 | 5.4 | 1.4 | 2.4 |
| Thermal Resistance | Compression Set (%) | | 25 | 24 | 36 | 30 | 26 | 30 | 28 | Crushed |
| Plasma Resistance | Weight Reduction Rate (%) | | 4.3 | 3.2 | 2.4 | 2.2 | 2.1 | 2.3 | 3 | 2.2 |
| | Dust Generation | | B | B | A | A | A | A | B | A |

Table 1 shows the formulation of the rubber composition and test evaluation results for the seal materials of Examples 1 to 5 and Comparative Examples 1 to 9 and 13.

Examples 1 to 5, where the phenol resin powder is added, each show the improved (reduced) compression set and the improved hardness and modulus as compared to Comparative Example 1, where the phenol resin powder is not added.

Moreover, Examples 1 to 5 are superior in the compression set to Comparative Examples 2 to 4 where carbon black is added. Further, Comparative Examples 2 to 4 show dust generation after plasma irradiation, but Examples 1 to 5 show no dust generation after plasma irradiation. The weight reduction rates of Examples 1 to 5 are lower than the weight reduction rates of Comparative Examples 2 to 4. Thus, Examples 1 to 5 are superior in the plasma resistance to Comparative Examples 2 to 4.

Moreover, Examples 1 to 5 are superior in the compression set to Comparative Examples 5 to 8 where silica, the silica-melamine complex, or PVDF are added.

Moreover, Examples 1 to 5 are superior in the compression set to Comparative Example 9 where PTFE is added. Further, Comparative Example 9 shows dust generation after plasma irradiation, but Examples 1 to 5 show no dust generation after plasma irradiation.

As described above. Examples 1 to 5, where fluororubber is used as the rubber component and the phenol resin powder is added, achieve the improved compression set and the improved plasma resistance (reduced generation of dust due to plasma irradiation).

Comparative Example 13 is similar to Examples 1 to 5 in that the phenol resin powder is added. However, the average particle size of the phenol resin powder of Examples 1 to 4 is 1.5 μm and the average particle size of the phenol resin powder of Example 5 is 5.8 μm, whereas the average particle size of phenol of Comparative Example 13 is 22 μm. Comparative Example 13 did not show improved compression set, and was crushed under the measurement conditions similar to those of Examples 1 to 5, This means that there is a preferred range for the particle size of the phenol resin powder. For example, the range is preferably 20 μm or less, more preferably 10 μm or less, and much more preferably 6 μm or less.

Among Examples 1 to 4 different from each other only in the content of the phenol resin powder, Example 2 is the best in terms of the compression set. The content of the phenol resin powder with respect to 100 parts by mass of the rubber component is preferably 1 part by mass or more. The content is preferably 50 parts by mass or less, more preferably 25 parts by mass or less, and much more preferably 15 parts by mass or less.

TABLE 2

| | | | Example | | Comparative Example | | | | |
|---|---|---|---|---|---|---|---|---|---|
| | | | 6 | 7 | 3 | 10 | 14 | 15 | 16 |
| Base Rubber | FKM | Tecnoflon P959 | 100 | — | 100 | — | — | — | — |
| | | Viton E60C | — | 100 | — | 100 | — | — | — |
| | VMQ | KE-871C-U | — | — | — | — | 100 | 100 | — |
| | EPDM | EP51 | — | — | — | — | — | — | 100 |
| Crosslinking Agent | Organic Peroxide | PERHEXA 25B | 1.5 | — | 1.5 | — | — | — | 1.5 |
| | | C-8 | — | — | — | — | 1 | 1 | — |
| Crosslinking Aid | Polyfunctional Compound | TAIC | 2 | — | — | — | — | — | 2 |
| Acid Acceptor | Magnesium Oxide | Kyowamag 150 | — | 3 | — | 3 | — | — | — |
| | Calcium Hydroxide | CALVIT | — | 6 | — | 6 | — | — | — |
| Filler | Phenol Resin | BellPearl R100 | 10 | 10 | — | — | — | 10 | 10 |
| | Carbon Black | Thermax N990 | 10 | 25 | 10 | 25 | — | — | — |
| Normal Physical Properties | Hardness (Type-A) | | 64 | 71 | 55 | 68 | 70 | 72 | Unmeasurable due to surface layer cracking |
| | Tensile Strength (Mpa) | | 21.5 | 18.9 | 14.5 | 16.6 | 7.4 | 7.3 | |
| | Elongation (%) | | 200 | 180 | 210 | 190 | 180 | 160 | |
| | 100% Modulus (Mpa) | | 5.1 | 8.9 | 2.8 | 7 | 5.3 | 6 | |
| Thermal Resistance | Compression Set (%) | | 13 | 9 | 25 | 18 | 10 | 18 | |

Table 2 shows the formulation of the rubber composition and test evaluation results for the seal materials of Examples 6 and 7 and Comparative Examples 3, 10, and 14 to 17.

Example 6 and Comparative Example 3 are examples where carbon black is added. Example 6 is different from Comparative Example 3 in that the phenol resin powder is further added. Preferably, the seal material for the semiconductor manufacturing device does not contain carbon black in order to avoid dust generation. However, it is conceivable that carbon black is added due to, e.g., requirement associated with other properties.

Example 6 and Comparative Example 3 show the improved compression set due to addition of the phenol resin powder, even with carbon black added.

Both of Example 7 and Comparative Example 10 are made of fluororubber subjected to polyol crosslinking, with carbon black added. Example 7 is different from Comparative Example 10 in that the phenol resin powder is further added.

The comparison between these examples shows that the fluororubber subjected to polyol crosslinking, too, shows improved compression set due to addition of the phenol resin powder.

In both of Comparative Examples 14 and 15, silicone rubber is used as the rubber component. The phenol resin powder is not added in Comparative Example 14, and is added in Comparative Example 15. Comparative Example 15 has degraded compression set as compared to Comparative Example 14. This means that in the case of silicone rubber, addition of the phenol resin powder does not improve the compression set.

In Comparative Example 16, EPDM is used as the rubber component, and the phenol resin powder is added. In Comparative Example 16, a surface layer cures strongly after vulcanization and is cracked. The hardness, the compression set, and other properties are not measurable, and the seal material of Comparative Example 16 is not suitable as the seal material.

These results show that using fluororubber as the rubber component and addition of the phenol resin powder improve the compression set.

TABLE 3

| | | | Example | | Comparative Example | | |
|---|---|---|---|---|---|---|---|
| | | | 8 | 9 | 1 | 11 | 12 |
| Base Rubber | FKM | Tecnoflon P959 | 100 | 100 | 100 | 100 | 100 |
| Crosslinking Agent | Organic Peroxide | PERHEXA 25B | 1.5 | 0.3 | 1.5 | 1.5 | 0.3 |
| Crosslinking Aid | Polyfunctional Compound | TAIC | 2 | 2 | 2 | 2 | 2 |
| Filler | Phenol Resin | BellPearl R100 | 10 | 10 | — | — | — |
| | Carbon Black | Thermax N990 | — | — | — | 10 | 10 |
| Vulcanization Rate | t90 (minute) | | 2.5 | 4.1 | 3.6 | 3.8 | 7.0 |
| Press Conditions | Temperature (° C.) | | 160 | 160 | 160 | 160 | 160 |
| | Time (minute) | | 5 | 5 | 10 | 5 | 5 |
| Normal Physical Properties | Hardness (Type-A) | | 58 | 57 | 51 | 55 | 52 |
| | Tensile Strength (Mpa) | | 14.1 | 13.9 | 8.9 | 14.4 | 13.2 |
| | Elongation (%) | | 220 | 220 | 290 | 220 | 250 |
| | 100% Modulus (Mpa) | | 2.7 | 2.6 | 1.3 | 2.8 | 2.2 |
| Thermal Resistance | Compression Set (%) | | 14 | 10 | 27 | 27 | 39 |

Table 3 shows the formulation of the rubber composition and test evaluation results for the seal materials of Examples 8 and 9 and Comparative Examples 1, 11, and 12.

Example 8 is different from Comparative Example 1 in that the phenol resin powder is added. Comparative Example 11 is different from Comparative Example 1 in that carbon black is added.

The vulcanization rate (t90) of Example 8 is faster than that of Comparative Example 1. However, the vulcanization rate of Comparative Example 11 is not accelerated. This means that addition of the phenol resin powder has the effect of accelerating the vulcanization rate. This effect is not provided by carbon black.

Example 9 is an example where the content of the crosslinking agent is decreased to one fifth of that in Example 8. In this case, as well, the vulcanization rate (t90) is sufficiently fast, and vulcanization has progressed sufficiently in the vulcanization time of 5 minutes. As a result, the compression set is further improved.

On the other hand, Comparative Examples 11 and 12 are examples where the phenol resin powder is not added, and are different from each other only in the content of the crosslinking agent. Comparative Example 12 contains a fewer amount of the crosslinking agent as compared to Comparative Example 11, and therefore shows a slower vulcanization rate (t90). As a result, vulcanization does not progress sufficiently in the vulcanization time of 5 minutes, and the compression set is degraded.

INDUSTRIAL APPLICABILITY

The seal material of the present disclosure has improved compression set and reduced dust generation upon exposure to plasma, and is thus useful particularly as a seal material for a semiconductor manufacturing device.

The invention claimed is:

1. A seal material for a semiconductor manufacturing device, the seal material being made of a rubber composition containing fluororubber and phenol resin powder, and a crosslinking agent, a content of the phenol resin powder being 1 part by mass or more and 10 parts by mass or less with respect to 100 parts by mass of the fluororubber, an average particle size of the phenol resin powder being 1 μm or more and 6 μm or less, the phenol resin powder having a free phenol content of 500 parts per million or less, and the crosslinking agent being a polyol or a peroxide.

2. The seal material of claim 1, wherein the rubber composition further contains silica powder, and the silica powder has a specific surface area of 50 $m^2$/g or more.

3. The seal material of claim 1, wherein the rubber composition further contains a hydrogen site protecting agent, and the hydrogen site protecting agent contains at least one of a compound having a perfluoro skeleton having an alkenyl group or a compound having a siloxane skeleton having an alkenyl group.

* * * * *